United States Patent [19]

Wincn et al.

[11] Patent Number: 4,542,308
[45] Date of Patent: Sep. 17, 1985

[54] SAMPLING COMPARATOR CIRCUIT FOR PROCESSING A DIFFERENTIAL INPUT

[75] Inventors: John M. Wincn, Cupertino; Thierry M. Laurent, Sunnyvale, both of Calif.

[73] Assignee: Advanced Micro Devices, Inc., Sunnyvale, Calif.

[21] Appl. No.: 452,473

[22] Filed: Dec. 23, 1982

[51] Int. Cl.[4] .................... H03K 3/286; G11C 8/00
[52] U.S. Cl. ..................................... 307/494; 307/493; 307/497; 307/291; 328/206; 330/112; 330/260
[58] Field of Search .............. 307/493, 494, 497, 498, 307/501, 350, 530, 352, 353, 247 R, 279, 291; 328/195, 206; 330/112, 260

[56] References Cited

U.S. PATENT DOCUMENTS

| | | | |
|---|---|---|---|
| 4,041,333 | 8/1977 | Porat | 307/279 |
| 4,146,802 | 3/1979 | Moench | 307/279 |
| 4,150,311 | 4/1979 | Matsuda et al. | 307/279 X |

Primary Examiner—Stanley D. Miller
Assistant Examiner—D. R. Hudspeth
Attorney, Agent, or Firm—Eugene H. Valet; Patrick T. King; Martin C. Fliesler

[57] ABSTRACT

An MOS sampling comparator circuit including a differential amplifier for producing first and second amplified signals, a first positive feedback circuit for further amplifying the first amplified signal, a second positive feedback circuit for further amplifying the second amplified signal, a strobed latch, having a positive feedback circuit, for further amplifying and storing the signals from the first and second positive feedback circuits, and a circuit for outputting complementary logic signals in response to the latched signals. By providing the first and second positive feedback circuits, small analog differential voltage input signals to the differential amplifier are further amplified and coupled without delay to the latch, resulting in an accurate conversion of the analog input signals to logic signals at high speed.

11 Claims, 2 Drawing Figures

SAMPLING COMPARATOR CIRCUIT FOR PROCESSING A DIFFERENTIAL INPUT

TECHNICAL FIELD

This invention relates generally to apparatus for processing an input signal and, more particularly, to an MOS comparator circuit for converting a differential input signal to complementary logic signals.

BACKGROUND ART

Apparatus for processing a signal to convert it from one form to another are well-known and are used for a variety of purposes. One type of apparatus is a strobed or sampling comparator circuit which has one operational mode for sampling an analog input signal and another operational mode for storing the sampled signal. The comparator circuit has an amplifying stage for amplifying the input signal and a storage stage for storing a sample of the amplified signal. An output stage of the comparator circuit then produces logic level signals in response to the stored signal.

One specific comparator circuit, implemented with MOS technology, is described in an article entitled A Highly Sensitive Strobed Comparator, by Akira Yukawa, IEEE Journal of Solid State Circuits, Vol. SC-16, No. 2, pp. 109–113, Apr., 1981. This comparator circuit has a first or input stage which is a differential amplifier for amplifying a differential voltage input signal, a second stage which is a strobed cross-coupled latch or flip-flop for storing and further amplifying the differential signal, and an intermediate stage which has depletion transistors for propagating the amplified signals from the differential amplifier to the latch and for limiting the current flow from the differential amplifier to the latch when the latter is strobed or enabled. The latch further amplifies the amplified signal received from the differential amplifier through the large gain of the latch applied in positive feedback. During the sampling mode, the latch is disabled or defeated, i.e., not strobed, and the differential input signal is continuously amplified by the amplifier, while in the storing mode the latch is enabled, i.e., strobed, to sample, store and further amplify the differential signal. An output stage of Yukawa then converts the stored signal to complementary logic levels.

One purpose of all such comparator circuits, including Yukawa, is to make an accurate comparison of small differential voltage input signals at high speed. Accuracy is achieved by employing the differential amplifier to amplify the small differential voltage input signal and employing the cross-coupled latch to amplify further this input signal through positive feedback. Such an accurate comparator circuit is said to be sensitive to the small differential voltages at its inputs.

In Yukawa, however, the speed of the MOS comparator circuit is constrained by the use of the intermediate stage of depletion transistors. As described in Yukawa, these depletion transistors are modeled as a resistive load for the latch which, together with the latch capacitance, provide an RC network that determines the speed of the signal processing or coupling between the differential amplifier and latch. The RC network provides signal delay which reduces the comparator circuit speed below optimum. This RC delay is in addition to signal delay caused by parasitic capacitances that electronic circuits inherently have.

Another type of strobed or sampling comparator circuit is disclosed in U.S. Pat. No. 3,843,934, by James N. Giles, issued Oct. 22, 1974 and assigned to the assignee of the present invention. This comparator circuit also includes a differential amplifier for amplifying a differential voltage input signal and a latch, having positive feedback, for further amplifying and storing the input signal. This comparator circuit is implemented in bipolar technology which is inherently faster than MOS technology and, therefore, does not have the same signal delay problems typically associated with MOS-type circuits.

SUMMARY OF THE INVENTION

The invention is an apparatus for processing an input signal, including means for amplifying the input signal to produce a first amplified signal, first means for providing positive feedback of the first amplified input signal to produce a second amplified signal and means for sampling the second amplified signal and for storing a third amplified signal, including second means for providing positive feedback of the second amplified signal to produce the third amplified signal.

By providing two positive feedback paths, one of which further amplifies the input signal amplified by the amplifying means and couples this further amplified signal to the other positive feedback path of the sampling and storing means, the speed of the apparatus is enhanced and approaches optimum speed. In a specific implementation, the apparatus uses MOS technology and the one positive feedback path includes a pair of cross-coupled transistors. The one positive feedback path does not have an RC network that reduces signal speed, but its speed is limited by a minor amount due to parasitic capacitances and the current that is available in the apparatus to charge the parasitic capacitor, as is typical for all circuits.

BEST MODE FOR CARRYING OUT THE INVENTION

Figure 1:
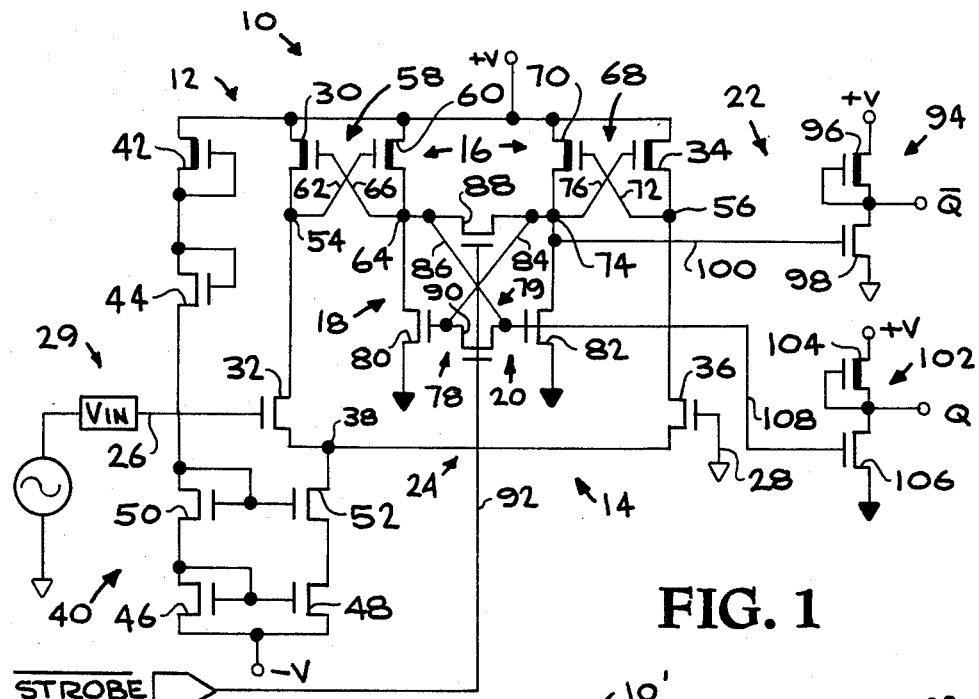
FIG. 1 is a schematic illustration of one embodiment of the present invention.

FIG. 1 shows an apparatus 10 for processing an input signal. The apparatus 10, as shown in FIG. 1 and in the legend, is implemented using MOS technology; however, the principles of the invention can be applied to an apparatus 10 employing other technology, such as bipolar. Furthermore, the apparatus 10 can be made using LSI (large scale integration) techniques.

Apparatus 10 is, in particular, a strobed or sampling comparator circuit 12 having means 14 for amplifying an input signal, means 16 for providing regenerative or positive feedback of the amplified input signal to produce a further amplified input signal and means 18 for sampling and for storing a sample of the latter signal. The sampling and storing means 18 includes means 20 for providing regenerative or positive feedback of the latter signal to further amplify the input signal. In addition, the comparator circuit 12 has means 22 for producing complementary logic output signals $\overline{Q}$, Q in response to the sampled signal amplified and stored in means 18.

Means 14 includes a differential amplifier 24, having an input 26 and an input 28, which amplifies the difference between input voltage signals to be compared. Input 26 receives, for example, a sinusoidal input voltage signal, as shown generally at 29, while input 28 is coupled to analog ground which functions as a reference voltage input. Differential amplifier 24 includes a series-connected load transistor 30 and driver transistor 32 and a series-connected load transistor 34 and driver transistor 36. Transistor 30 and transistor 34 have their drains connected in common to +V, while transistor 32 and transistor 36 have their sources coupled in common to a junction 38 leading to −V via a current source and biasing network 40.

Network 40 includes a transistor 42, a transistor 44, a transistor 46 and a transistor 48 which function to bias the transistors 30, 32, 34, 36 of differential amplifier 24 into their saturated region. A transistor 50 and a transistor 52 are included in network 40 to increase the output impedance of differential amplifier 24 for well-known reasons, such as for a reduction in "common mode gain" of the amplifier 24.

Differential amplifier 24 has a forward gain which is proportional to the square root of the ratio of the geometry of transistor 32 to transistor 30 and of transistor 36 to transistor 34. The magnitude of the forward gain can be chosen in accordance with the expected magnitude and frequency content of the differential input signal to be amplified. Differential amplifier 24 has one signal output at a node 54, coupled between transistor 30 and input 26 via transistor 32, and another signal output at a node 56 coupled between transistor 34 and input 28 via transistor 36. When a voltage signal from source 29 is applied to input 26, the output voltage signals at node 54 and at node 56 will be continuously amplified by an amount directly proportional to the forward gain of amplifier 24. Also, the voltage signal appearing at node 54 and at node 56 will be inverted versions of one another, as indicated by the waveforms shown at these nodes.

Means 16 includes a pair 58 of cross-coupled transistors, one of which is transistor 30 and the other of which is a transistor 60. Cross-coupling is accomplished by coupling the node 54, which is also an input for means 16, to the control gate of transistor 60 via a line 62 and by coupling a node 64 to the control gate of the transistor 30 via a line 66. Means 16 also includes a pair 68 of cross-coupled transistors, one of which is transistor 34. The other of the pair 68 is a transistor 70. Cross-coupling is accomplished by coupling the node 56, which is also an input to means 16, to the control gate of transistor 70 over a line 72 and by coupling a node 74 to the control gate of transistor 34 over a line 76.

Positive feedback, i.e., regenerative amplification, of the amplified voltage signal at node 54 is performed in the following manner. Assume that, for example, the signal at node 54 presently is most negative. This negative signal at node 54 then drives transistor 60 partially off, resulting in the source of transistor 60 being coupled to node 64 going more negative. With the voltage signal at node 64 going more negative, transistor 30 is partially turned off, causing the source of transistor 30 being coupled to node 54 going more negative than before. This more negative voltage signal at node 54 further drives off transistor 60, causing the voltage signal at node 64 to go further negative and drive transistor 30 further off. This regenerative or positive feedback cycle repeats, thereby driving the signal at node 64 further and further negative.

Similarly, and with the voltage signal at node 54 being negative, the voltage signal at node 56 is positive. This drives transistor 70 partially on, causing its source being coupled to node 74 to go more positive. The more positive voltage signal at node 74 drives transistor 34 partially on, causing its source being coupled to node 56 to go further positive. This more positive voltage signal at node 56 then drives transistor 70 further on, resulting in the voltage signal at node 74 going still more positive and driving transistor 34 still further on. This regenerative or positive feedback cycle repeats, thereby driving the signal at node 74 further and further positive.

The positive feedback provided by the transistor pair 58 and the transistor pair 68 also occurs when the voltage signal at node 54 is positive and the voltage signal at node 56 is negative. The result of the positive feedback process is that the voltage signal at node 64 is amplified to become more positive and the voltage signal at node 74 is amplified to become more negative.

As will be more fully described, apparatus 10 has a bi-modal operation. One mode is a sampling or signal acquisition mode in which the differential input signal being continuously amplified by differential amplifier 24 and the dual transistor pairs 58, 68, is sampled, and the other mode is a strobed or latched mode in which a sampled signal is stored in means 18. During the sampling mode, node 64 and node 74 are coupled together, so that the complementary voltage signals at these nodes cancel each other. During the latched mode, node 64 and node 74 are isolated from one another, and are inputs to storing means 18, so that the voltage signals at these nodes are processed by means 18.

Means 20 of storing means 18 includes a latch 78 having a pair 79 of cross-coupled transistors 80, 82. Transistor 80 has its gate coupled to node 74 via a line 84, with its drain being coupled to node 64 and its source to digital ground. Transistor 82 has its gate coupled to node 64 via a line 86, with its drain coupled to node 74 and its source coupled to digital ground. A transistor 88 controls the coupling between node 64 and node 74, and a transistor 90 controls in common the gating on and off of transistors 80, 82. A line 92 carries a control signal $\overline{\text{STROBE}}$ to turn on and off, in common, transistors 88, 90. $\overline{\text{STROBE}}$ is at logic 1 during the sampling mode to disable or defeat latch 78 by turning on transistors 88, 90 and at logic 0 during the storing mode to enable latch 78 by turning off transistors 88, 90.

In the operation of latch 78, assume that, in accordance with the example given above, the voltage signal at node 54 and hence node 64 is slightly more negative with respect to their quiescent or undisturbed values and, therefore, that the voltage signal at node 56 and hence node 74 is slightly more positive with respect to their quiescent or undisturbed values. During the sampling mode, $\overline{\text{STROBE}}$ is at logic 1 to turn on transistor 88, as well as transistor 90. With transistor 88 being on to couple node 64 to node 74, the negative voltage signal at node 64 and the positive voltage signal at node 74 cancel one another.

Then, for the storing mode, $\overline{\text{STROBE}}$ goes to logic 0, which turns off transistor 88 to isolate node 64 from node 74, and which turns off transistor 90. The negative voltage signal at node 64 then begins to turn off transistor 82, resulting in the signal at node 74 going to a higher voltage. This higher voltage signal then turns on transistor 80 further, causing node 64 to become even more negative. The more negative voltage signal at node 64 further turns off transistor 82 to further increase the voltage signal at node 74, and the regenerative or positive feedback process continues to provide infinite gain for driving means 22, as will be described.

A similar positive feedback operation occurs if node 64 is positive with respect to node 74. In this case, transistor 82 is further turned on by the positive voltage signal at node 64 and transistor 80 is further turned off by the negative voltage signal at node 74 to provide the infinite gain.

The means 22 for producing complementary logic signals includes an inverter shown generally at 94, having series connected transistors 96, 98, that produces a logic level output $\overline{Q}$, with transistor 98 having its gate coupled between node 74 and transistor 82 via a line 100. Means 22 also includes an inverter shown generally at 102, having series connected transistors 104, 106, that produces a logic level output Q, with transistor 106 having its gate coupled to the gate of transistor 82 over a line 108. The outputs $\overline{Q}$, Q are driven to go to complementary logic states, i.e., 1 and 0, in accordance with the polarity of the voltage difference between node 54 and node 56 that existed prior to $\overline{STROBE}$ going to logic 0. For example, outputs $\overline{Q}$, Q will be, respectively, 01 when input conditions are such that node 64 is slightly more negative than its quiescent value and node 74 is slightly more positive than its quiescent value that existed prior to $\overline{STROBE}$ going to logic 0, and 10 when input conditions are such that node 64 is slightly positive than its quiescent value and node 74 is slightly more negative than its quiescent value that existed prior to $\overline{STROBE}$ going to logic 0.

In the overall operation of apparatus 10, during the sampling mode when $\overline{STROBE}$ is at logic 1, the voltage input signals at inputs 26, 28 are continuously amplified by differential amplifier 24 and produced at the outputs of nodes 54, 56. During this sampling mode, the signals that are impressed on node 64 and node 74 are precisely cancelled by virtue of having held line 92, coupled to transistors 88, 90, to logic 1. This cancellation occurs without disturbing the signals at node 54 and node 56.

Then, for the latched mode, $\overline{STROBE}$ goes to logic 0. The amplified signals that existed on node 54 and node 56 prior to $\overline{STROBE}$ going to logic 0 is impressed on node 64 and node 74 through the regenerative feedback of means 16. The outputs $\overline{Q}$ and Q then are driven to opposing logic states, through the regenerative feedback of means 16 and means 20, in accordance with the polarity of the voltage difference between node 54 and node 56 that existed prior to $\overline{STROBE}$ going to logic 0. Once the latch mode is initiated, the comparator circuit 12 is no longer sensitive to subsequent changes to the difference voltage applied between input 26 and input 28. A new sample then can be obtained by returning $\overline{STROBE}$ to logic 1. Thus, apparatus 10 can take a small voltage difference at inputs 26, 28 at the start of the sampling mode, and convert it to logic states $\overline{Q}$ and Q through the positive feedback circuits of means 16 and means 18.

Figure 2:
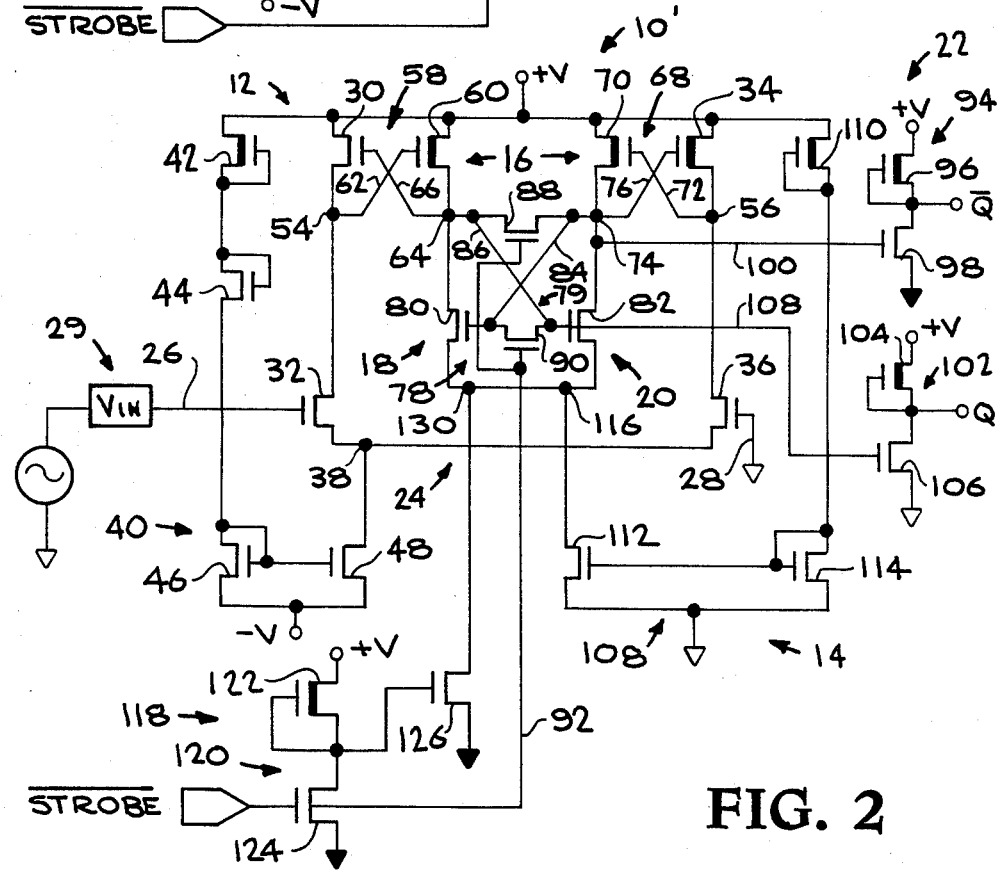
FIG. 2 is a schematic illustration of another embodiment of the present invention.

FIG. 2 shows an apparatus 10' which is the same as apparatus 10, except as discussed below. Like reference numerals are used to show like elements. Thus, apparatus 10' shown in FIG. 2 includes, in addition to that shown in FIG. 10, means 108 for maintaining or biasing transistors 60, 70, 80, 82, in saturation and transistors 88, 90 in the triode region. Means 108 has a transistor 110 and transistors 112, 114 coupled between +V and digital ground, as shown, with transistor 112 having its drain coupled in common to transistors 80, 82 at a junction 116. Also, transistors 50, 52 can be and are eliminated from the network 40 without affecting the basic operation of the invention.

Furthermore, a logic level driver 118 can be added to apparatus 10' to drive or control the bi-modal operation. Driver 118 is an inverter 120 having series connected transistors 122, 124 coupled between +V and digital ground, together with a transistor 126 whose gate is coupled at junction 128 between transistors 122, 124 and whose drain is coupled at a junction 130 which is common to transistors 80, 82. When $\overline{STROBE}$ is at logic 1 for the sampling mode, transistor 124 is turned on, the gate of transistor 126 is at logic 0 to turn transistor 126 off and transistors 88, 90 are turned on by $\overline{STROBE}$ on line 92. At this time, transistor 116 provides a level of bias current to maintain channel saturation of transistors 80, 82, as well as transistors 60, 70, and the latch 76 is defeated. When $\overline{STROBE}$ is at logic 0 for the latched mode, transistor 124 is turned off, transistor 126 is turned on and transistors 88, 90 are turned off, and the latched mode of operation occurs as previously described. The turning on of transistor 126 causes the transistors 80, 82 and transistors 60, 70 to move towards the triode or non-saturation region.

In summary, both apparatus 10 and apparatus 10' can detect differences in voltage at the inputs 26, 28 during the sampling mode and, by applying amplification through the positive feedback circuits of means 16 and means 20, convert these differences, particularly if they are small, to full logic levels $\overline{Q}$, Q. The cross-coupled transistors 30, 60 of one means 16 and the cross-coupled transistors 34, 70 of the other means 16 allow the signals appearing at nodes 64, 74 to be amplified and coupled to latch 76 very quickly, with the only constraints on the signal processing speed being the inherent parasitic capacitances in means 16 and the amount of current available to charge the parasitic capacitors (not shown).

Other aspects, objects and advantages of the invention will be apparent from a study of the drawings and the appended claims.

We claim:

1. A sampling comparator circuit for processing a differential input, having a first input signal and a second input signal, comprising:
    differential amplifier means for amplifying said first input signal and said second input signal to produce first amplified signals;
    first feedback means, coupled to said differential amplifier means, for providing positive feedback of said first amplified signals to produce second amplified signals;
    second feedback means, coupled to said first feedback means, for providing positive feedback of said second amplified signals to produce third amplified signals;
    strobe means coupled to said second feedback means, for sampling said second amplified signals during a first strobe state and for enabling said first and second feedback means only during a second strobe state; and
    output means, coupled to said second feedback means, for producing logic output signals in response to said third amplified signals.

2. The circuit according to claim 1, wherein said first feedback means comprises:
    first and second cross-coupled transistors;
    first and second nodes said first node being an input coupled to receive the amplified first input signal and said second node being an output coupled to said second feedback means;

third and fourth cross-coupled transistors; and third and fourth nodes, said third node being an input coupled to receive the amplified second input signal and said fourth node being an output coupled to said second feedback means.

3. The circuit according to claim 2, wherein said first, second, third and fourth transistors are MOS transistors.

4. The circuit according to claim 2, wherein said second feedback means comprises means for selectively coupling said second node to said fourth node.

5. The circuit according to claim 4, wherein said means for coupling comprises:

a pair of coupling transistors; and means for providing an on and off control signal to and coupling transistors.

6. The circuit according to claim 5, wherein said coupling transistors are MOS transistors.

7. An MOS sampling comparator circuit for converting a differential input, constituting a first input signal and a second input signal, to complementary logic signals, comprising:

differential amplifier means, having a first input electrode for receiving said first input signal, a second input electrode for receiving said second input signal, a first output electrode and a second output electrode, for producing a first amplified input signal at said first output electrode and a second amplifier input signal at said second output electrode;

first means, coupled to said differential amplifier means, for providing positive feedback of said first amplified input signal to produce a first positive feedback signal;

second means, coupled to said differential amplifier means, for providing positive feedback of the second amplified input signal to produce a second positive feedback signal;

third means, coupled to said first and second means, for providing positive feedback of said first positive feedback signal and said second positive feedback signal to produce third amplified signals; including latch means, coupled to said third means, for latching said comparator circuit to said third amplified signals; and means for outputting complementary logic signals in response to said third amplified signals.

8. An MOS sampling comparator circuit according to claim 7 wherein said first means for providing comprises:

first and second cross-coupled transistors; and first and second nodes, said first node being coupled at said first output electrode between said first transistor and said first input electrode, and said second node being coupled between said second transistor and said latching means.

9. An MOS sampling comparator circuit according to claim 8 wherein said second means for providing comprises:

third and fourth cross-coupled transistors; and third and fourth nodes, said third node being coupled at said second output electrode between said third transistor and said second input electrode and said fourth node being coupled between said fourth transistor and said latching means.

10. An MOS sampling comparator circuit according to claim 9 wherein said third means comprises:

fifth and sixth cross-coupled transistors, said fifth transistor being coupled to said fourth node and said sixth transistor being coupled to said second node;

a seventh transistor coupled between said second node and said fourth node;

an eighth transistor coupled between said fifth transistor and said sixth transistor; and means for strobing off in common said seventh transistor and said eighth transistor to enable said latching means and for strobing on in common said seventh transistor and said eighth transistor to disable said latching means.

11. An MOS strobed comparator circuit for converting a differential voltage signal, constituting first and second signals, to complementary logic level signals, comprising:

(a) a differential amplifier, having a first input electrode, second input electrode, a first output node and a second output node, for amplifying the differential voltage signal, said first input electrode receiving said first signal and said first output node outputting said first signal amplified, and said second input receiving said second signal and said second output node outputting, said second signal amplified;

(b) a first pair of cross-coupled first and second transistors for providing first regenerative signal feedback, said first pair having said first output node as an input and a third output node, said first transistor being common to said differential amplifier and having a source coupled to said first output node and a gate coupled to said third output node, and said second transistor having a source coupled to said third output node and a gate coupled to said first output node;

(c) a second pair of cross-coupled third and fourth transistors for providing first regenerative signal feedback, said second pair having said second output node as an input and a fourth output node, said third transistor being common to said differential amplifier and having a source coupled to said output node and a gate coupled to said fourth output node, and said fourth transistor having a source coupled to said fourth output node and a gate coupled to said second output node;

(d) a latch for providing second regenerative signal feedback, said latch having a pair of fifth and sixth cross-coupled transistors, said fifth transistor having a drain coupled to said third output node and a gate coupled to said fourth output node, said sixth transistor having a drain coupled to said fourth output node and a gate coupled to said third output node, and said latch further having a seventh transistor for coupling together and for isolating from one another said third output node and said fourth output node, an eighth transistor for coupling together and for isolating from one another said gate of said fifth transistor and said gate of said sixth transistor, and strobe means for turning on and off said seventh transistor and said eighth transistor; and (e) means, connected to said latch, for outputting the complementary logic level signals.

* * * * *